(12) United States Patent
Yoshikawa

(10) Patent No.: US 10,212,814 B2
(45) Date of Patent: Feb. 19, 2019

(54) COPPER FOIL PROVIDED WITH CARRIER FOIL, MANUFACTURING METHOD OF THE COPPER FOIL PROVIDED WITH CARRIER FOIL, AND COPPER CLAD LAMINATE FOR LASER DRILLING MANUFACTURED BY USING THE COPPER FOIL PROVIDED WITH CARRIER FOIL

(71) Applicant: MITSUI MINING & SMELTING CO., LTD., Tokyo (JP)

(72) Inventor: Kazuhiro Yoshikawa, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 14/381,367

(22) PCT Filed: Feb. 27, 2013

(86) PCT No.: PCT/JP2013/055208
§ 371 (c)(1),
(2) Date: Jun. 12, 2017

(87) PCT Pub. No.: WO2013/129508
PCT Pub. Date: Sep. 6, 2013

(65) Prior Publication Data
US 2015/0044492 A1 Feb. 12, 2015

(30) Foreign Application Priority Data
Mar. 1, 2012 (JP) ................................ 2012-045811

(51) Int. Cl.
*C25D 5/10* (2006.01)
*B32B 15/20* (2006.01)
(Continued)

(52) U.S. Cl.
CPC ............. *H05K 1/09* (2013.01); *B23K 26/382* (2015.10); *B23K 26/40* (2013.01); *B32B 7/06* (2013.01);
(Continued)

(58) Field of Classification Search
CPC ........... B32B 15/01; B32B 15/20; B32B 7/06; H05K 1/09
See application file for complete search history.

(56) References Cited

U.S. PATENT DOCUMENTS 2,975,072 A * 3/1961 Bryant .................... C23D 3/00
138/146
6,541,126 B1 4/2003 Yoshioka et al.
(Continued)

FOREIGN PATENT DOCUMENTS

| EP | 1 139 704 | 10/2001 |
|----|-----------|---------|
| EP | 1 273 682 | 1/2003 |

(Continued)

OTHER PUBLICATIONS

English machine translation of Matsunaga (JP 2005-048277), EPO, accessed Feb. 21, 2017.*
(Continued)

*Primary Examiner* — Humera N Sheikh
*Assistant Examiner* — Xiaobei Wang
(74) *Attorney, Agent, or Firm* — Greenblum & Bernstein, P.L.C.

(57) ABSTRACT

An object of the present invention is to improve the laser drilling performance of a copper clad laminate whose black-oxide treated surface is used as a laser drilled surface. To achieve the object, a copper foil provided with a carrier foil 1 comprising a layer structure of the carrier foil 2/the releasing layer 3/the bulk copper layer 4 characterized in that metal element-containing particles 5 are disposed
(Continued)

between the releasing layer 3 and the bulk copper layer 4 is employed. If the present copper foil provided with a carrier foil is used, a black-oxide treated layer having a color tone excellent in the laser drilling performance can be formed on the surface of the bulk copper layer in the copper clad laminate manufactured.

9 Claims, 7 Drawing Sheets

(51) Int. Cl.

| | |
|---|---|
| B32B 7/06 | (2006.01) |
| H05K 1/09 | (2006.01) |
| B32B 15/04 | (2006.01) |
| C25D 1/04 | (2006.01) |
| C25D 1/22 | (2006.01) |
| C25D 3/38 | (2006.01) |
| C25D 7/06 | (2006.01) |
| H05K 3/02 | (2006.01) |
| H05K 3/00 | (2006.01) |
| H05K 3/38 | (2006.01) |
| B23K 26/40 | (2014.01) |
| B23K 26/382 | (2014.01) |
| C25D 3/02 | (2006.01) |
| C25D 3/12 | (2006.01) |
| C25D 5/12 | (2006.01) |
| C25D 9/08 | (2006.01) |
| B23K 103/12 | (2006.01) |

(52) U.S. Cl.
CPC .............. *B32B 15/04* (2013.01); *B32B 15/20* (2013.01); *C25D 1/04* (2013.01); *C25D 1/22* (2013.01); *C25D 3/38* (2013.01); *C25D 7/0614* (2013.01); *H05K 3/007* (2013.01); *H05K 3/025* (2013.01); *H05K 3/385* (2013.01); *B23K 2103/12* (2018.08); *B32B 2307/42* (2013.01); *B32B 2307/538* (2013.01); *B32B 2307/748* (2013.01); *C25D 3/12* (2013.01); *C25D 5/12* (2013.01); *C25D 9/08* (2013.01); *H05K 2201/032* (2013.01); *H05K 2201/0355* (2013.01); *H05K 2203/0152* (2013.01); *H05K 2203/107* (2013.01); *Y10T 428/12049* (2015.01)

(56) References Cited

U.S. PATENT DOCUMENTS

| | | | |
|---|---|---|---|
| 6,610,418 B1 | 8/2003 | Yoshioka et al. | |
| 6,779,262 B1* | 8/2004 | Gales | H05K 3/0038 174/261 |
| 6,924,043 B2 | 8/2005 | Suzuki et al. | |
| 2002/0182432 A1 | 12/2002 | Sakamoto et al. | |
| 2002/0192486 A1 | 12/2002 | Chen et al. | |
| 2003/0148136 A1 | 8/2003 | Yamamoto et al. | |
| 2004/0038049 A1 | 2/2004 | Suzuki et al. | |
| 2004/0121178 A1 | 6/2004 | Suzuki et al. | |
| 2004/0209106 A1* | 10/2004 | Gales | C25D 1/04 428/607 |
| 2005/0249927 A1 | 11/2005 | Suzuki et al. | |
| 2006/0147802 A1* | 7/2006 | Yasuda | C25D 1/04 429/233 |
| 2007/0141377 A1 | 6/2007 | Hanafusa | |
| 2011/0209903 A1 | 9/2011 | Uno et al. | |

FOREIGN PATENT DOCUMENTS

| | | | |
|---|---|---|---|
| JP | 11-261216 | | 9/1999 |
| JP | 2001-062955 | | 3/2001 |
| JP | 2001-068816 | | 3/2001 |
| JP | 2001-140090 A | | 5/2001 |
| JP | 2002-540609 A | | 11/2002 |
| JP | 2005-048277 | | 2/2005 |
| JP | 2009-214308 | * | 9/2009 |
| JP | 2009-235580 | | 10/2009 |
| TW | 1238027 | | 8/2005 |
| TW | 1338543 | | 3/2011 |
| WO | 02/24444 A1 | | 3/2002 |
| WO | 03/008671 A1 | | 1/2003 |
| WO | 2005/079130 A1 | | 8/2005 |
| WO | 2013/129508 | | 9/2013 |

OTHER PUBLICATIONS

English machine translation of Suzuki (JP 2009-214308), EPO, accessed Feb. 27, 2018.*
Office Action issued in Japanese Counterpart Patent App. No. 2014-502328, dated Aug. 16, 2016, with English translation.
Korean Office Action issued with respect to Application No. 2014-7023382, dated Jan. 21, 2016.
European Search Report issued with respect to application No. 13754984.6, dated Oct. 29, 2015.
Hirogaki et al., "Direct Laser Drilling in Copper Clad Printed Wiring Boards (Effect of Surface Treatment on Drilled Blind Via-Hole Quality)", *Department of Mechanical Engineering, Doshisha University*, pp. 1411-1417 (2008).
Office Action for Taiwanese Patent Application No. 102107225 dated Jun. 24, 2014; along with a partial English Translation thereof.
International Search Report of PCT/JP2013/055208 dated May 28, 2013; along with an English Translation thereof.
Office Action issued in corresponding EPO Counterpart Patent App. No. EP 13 754 984.6, dated May 9, 2018.

* cited by examiner (1)

(2)

(3)

(4)

Example Sample 1

Example Sample 7

Comparative Example Sample 1

Comparative Example Sample 2

Finished Shape of Hole After Laser Drilling Using Example Sample

Finished Shape of Hole After Laser Drilling Using Comparative Example Sample

COPPER FOIL PROVIDED WITH CARRIER FOIL, MANUFACTURING METHOD OF THE COPPER FOIL PROVIDED WITH CARRIER FOIL, AND COPPER CLAD LAMINATE FOR LASER DRILLING MANUFACTURED BY USING THE COPPER FOIL PROVIDED WITH CARRIER FOIL

TECHNICAL FIELD

The present invention relates to a copper foil provided with a carrier foil, a manufacturing method of the copper foil provided with a carrier foil, and a copper clad laminate for laser drilling manufactured by using the copper foil provided with a carrier foil.

BACKGROUND ART

For formation of a small-size via-hole of 100 μm or less on copper clad laminates in recent years, laser drilling is mainly used. To enhance the laser drilling performance, a method which carry out the so-called "black-oxide treatment" on the laser drilled sites of copper clad laminates and/or printed wiring boards to improve absorption of laser beam has been employed.

For example, Patent document 1 discloses the method including the steps; the step of subjecting a metal foil to a black-oxide treatment to provide a black-oxide film, the step of laminating the metal foil to an insulating substrate wherein the black-oxide film faces to bottom portions of the insulating substrate where via-holes are formed, the step of irradiating the laser beam on the insulating substrate to form via-holes having the metal foil as bottom parts, the step of subjecting a desmear treatment on the metal foil exposed at the bottom of via-holes, the step of carrying out soft etching on the metal foil exposed at the bottom of via-holes, the step of confirming that the soft etching leaves no black-oxide film on the metal foil surface at the bottom of via-holes, the step of forming a plated metal film inside the via-holes and the step of etching the metal foil to form a conductor pattern, to provide a printed wiring board having a high conductive reliability in via-holes and a manufacturing method.

As an invention using a black-oxide treated surface in the laser drilling, Patent document 2 discloses the method using a copper clad laminate which satisfies the conditions of a laser beam reflectance of 86% or lower and a luminosity (value L) of 22 or lower by forming fine copper oxide or fine copper particles on the surface of an outer layer copper foil of a copper clad laminate to provide a copper clad laminate suitable for formation of a through-hole and/or a blind-hole as through holes or via-holes for interlayer connection among copper foil circuit layers and an outer layer copper foil by using a laser method.

DOCUMENTS CITED

Patent Document

[Patent document 1] Japanese Patent Laid-Open No. 11-261216
[Patent document 2] Japanese Patent Laid-Open No. 2001-68816

SUMMARY OF INVENTION

Problems to be Solved

However, even in the black-oxide treatment specified in the Patent documents, some deviation exists in the laser drilling performance in copper clad laminates provided with a black-oxide treated layer in some cases. Consequently, formation of good via-holes is made difficult in some cases. If so, the product yield largely decrease in the formation of a fine wiring circuits.

Therefore, the market has been demanded the stabilized laser drilling on copper clad laminates provided with a black-oxide treated layer.

Means to Solve Problem

As a result of intensive studies, the present inventor has thought out that if a copper clad laminate manufactured by using a copper foil provided with a carrier foil described later and subjected to a black-oxide treatment, an excellent laser drilling performance exhibiting little deviation can be achieved. Hereinafter, the outline of the invention according to the present application will be described.

Copper foil provided with a carrier foil: the copper foil provided with a carrier foil comprising a layer structure of a carrier foil/a releasing layer/a bulk copper layer according to the present invention is characterized in that metal element-containing particles are disposed between the releasing layer and the bulk copper layer.

The metal element-containing particles constituting the copper foil provided with a carrier foil according to the present invention is preferable to contain one or more of elements selected from nickel, cobalt, molybdenum, tin and chromium.

In the metal element-containing particles constituting the copper foil provided with a carrier foil according to the present invention, the metal element-containing particles are preferable to be disposed to make the amount transferred on the surface of the bulk copper layer without carrier foil (F) 0 mg/m$^2$<F≤100 mg/m$^2$.

Manufacturing method of a copper foil provided with a carrier foil: the manufacturing method of a copper foil provided with a carrier foil according to the present invention is a manufacturing method of the copper foil provided with a carrier foil characterized in comprising step 1 to step 3 shown below.

Step 1: formation of a releasing layer on at least one surface of the carrier foil to prepare a carrier foil provided with the releasing layer.

Step 2: cathode polarizing of the carrier foil provided with the releasing layer in a metal element-containing electrolytic solution to deposit metal element-containing particles on a surface of the releasing layer to prepare a carrier foil provided with the metal element-containing particles and the releasing layer.

Step 3: cathode polarizing of the carrier foil provided with the metal element-containing particles and the releasing layer in a copper electrolytic solution to form a bulk copper layer on the surfaces of the metal element-containing particles and the releasing layer to finish the copper foil provided with a carrier foil.

Copper clad laminate: the copper clad laminate according to the present invention is a copper clad laminate for laser drilling manufactured by using the copper foil provided with a carrier foil characterized in that the carrier foil is released from the surface of the copper clad laminate provided with the copper foil provided with a carrier foil at an outer layer, a black-oxide treatment is subjected on the bulk copper layer exposing the metal element-containing particles on the surface, and the black-oxide treated surface is used as a laser drilled surface.

The copper clad laminate according to the present invention is preferable that the value a* and the value in the L*a*b* color space at the laser drilled surface satisfies a relationship; [the value a*]≥[the value b*].

Advantages of Invention

As the copper foil provided with a carrier foil according to the present invention dispersively expose the metal element-containing particles on the surface of the bulk copper layer after releasing the carrier foil since metal element-containing particles are dispersively transferred between a releasing layer and a bulk copper layer in a layer structure of a carrier foil/the releasing layer/the bulk copper layer. If the surface of the bulk copper layer is subjected to a black-oxide treatment, a suitable shape for laser drilling of the copper oxide grow in the black-oxide treatment stabilizes the laser drilling performance and achieves excellent laser drilling.

PREFERRED EMBODIMENTS OF INVENTION

Hereinafter, embodiments of the copper foil provided with a carrier foil, the manufacturing method of the copper foil provided with a carrier foil and the copper clad laminate according to the present invention will be described in order.
<Embodiment of the Copper Foil Provided with a Carrier Foil>

Figure 1:
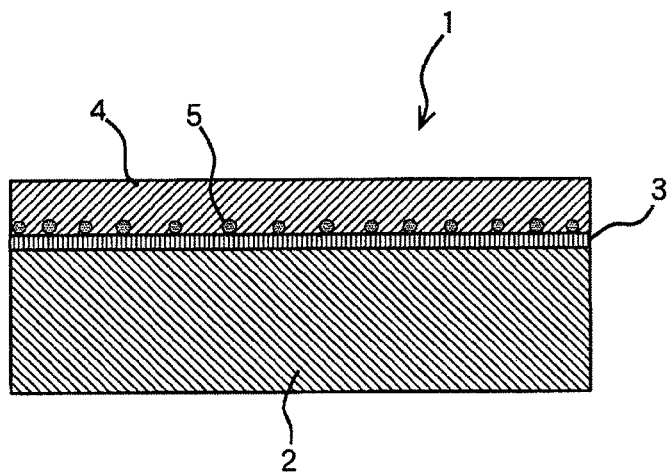
FIG. 1 is a schematic cross-sectional view demonstrating a layer structure of the copper foil provided with a carrier foil according to the present invention.

As shown in FIG. 1, the copper foil provided with a carrier foil 1 according to the present invention comprises a basic layer structure of the carrier foil 2/the releasing layer 3/the bulk copper layer 4 and is characterized in that the metal element-containing particles 5 are disposed between the releasing layer 3 and the bulk copper layer 4. The matter should be noted that as the schematic cross-sectional view in FIG. 1 is disclosed to make understanding of the layer structure of the copper foil provided with a carrier foil according to the present invention easy, the thickness of each layer does not reflect the thickness of an actual product. Then, each structural compound will be described one by one.

Copper foil provided with a carrier foil: the copper foil provided with a carrier foil according to the present invention is a copper foil provided with a carrier foil in which the carrier foil 2 and the bulk copper layer 4 are pasted via the releasing layer 3 in appearance. Any type of the copper foil provided with a carrier foil 1 may be used as long as the metal element-containing particles 5 are dispersively transferred on the surface of the bulk copper layer 4 after releasing the carrier foil 2. For example, an etchable-type copper foil provided with a carrier foil 1 is employed in which the carrier foil 2 should be removed by etching is acceptable as long as metal element-containing particles 5 are dispersively exposed on the surface of the bulk copper layer 4 after etching the carrier foil 2. However, it is preferable to employ a peelable-type copper foil provided with a carrier foil 1 in which the carrier foil 2 and the bulk copper layer 4 are physically peelable because of the releasing layer 3 provided. As the metal element-containing particles 5 are easy to be dispersively exposed on the surface of the bulk copper layer 4 after releasing the carrier foil 2.

Carrier foil: the material of a carrier foil according to the present invention is not especially limited as long as a bulk copper layer can be formed by electro-deposition of copper on the surface of the carrier foil. As the carrier foil, an aluminum foil, a copper foil or a metal-coated resin film can be used, for example. However, a copper foil is preferable for the carrier foil 2 since the recovery and recycle after releasing is easy. In a copper foil, either an electro-deposited copper foil or a rolled copper foil can be used. Thickness of a copper foil for the carrier foil 2 is not especially limited. A copper foil of 12 μm to 100 μm thick is mainly used. Surface roughness (Rzjis) of a copper foil to be provided with a releasing layer of the carrier foil 2 is preferable to be 1.5 μm or less. It is because if the surface roughness (Rzjis) is 1.5 μm or less, deviation in the thickness of the releasing layer 3 provided on the surface of the carrier foil 2 is made small. Although the lower limit of the surface roughness (Rzjis) is not specified, the lower limit of the surface roughness is about 0.1 μm from experience.

Releasing layer: the releasing layer 3 exists on the surface of the carrier foil 2. As a peelable-type copper foil provided with a carrier foil 1 is featured in the present invention, the releasing layer provided may be either of an inorganic releasing layer (an inorganic substance includes chromium, nickel, molybdenum, tantalum, vanadium, tungsten, cobalt and an oxide of them) and an organic releasing layer. If an organic releasing layer is employed, one or two or more of organic compounds selected from nitrogen-containing organic compounds, sulfur-containing organic compounds and carboxylic acids are preferable. Among these, a triazole compound having substituents including 1,2,3-benzotriazole, carboxybenzotriazole (hereinafter, referred to as "CBTA"), N',N'-bis (benzotriazolylmethyl) urea, 1H-1,2,4-triazole and 3-amino-1H-1,2,4-triazole are preferable as an organic releasing layer. Releasing of the carrier foil 2 and exposing of the metal element-containing particles 5 on the surface of the bulk copper layer 4 by releasing the carrier foil 2 are easy.

Metal element-containing particles: the metal element-containing particles are disposed on the releasing layer 3. The metal element-containing particles are preferable to contain one or two or more of elements selected from nickel, cobalt, molybdenum, tin and chromium. Specific constituents include "nickel", "nickel alloys including nickel-phosphorus, nickel-chromium, nickel-molybdenum, nickel-molybdenum-cobalt, nickel-cobalt, nickel tungsten and nickel-tin-phosphorus", "cobalt", "cobalt alloys including cobalt-phosphorus, cobalt-molybdenum, cobalt-tungsten, cobalt-copper, cobalt-nickel-phosphorus and cobalt-tin-phosphorus", "tin", "tin alloys including tin-zinc and tin-zinc-nickel", "chromium", "chromium alloys including chromium-cobalt and chromium-nickel".

The metal element-containing particles is preferable to be disposed to make amount of the metal element-containing particles transferred on the surface of the bulk copper layer without carrier foil (F) 0 mg/m$^2$<F≤100 mg/m$^2$. The amount of metal element-containing particles transferred on the surface of the bulk copper layer without carrier foil (F) of 0 mg/m$^2$ is not preferable since formed black-oxide is not suitable for laser drilling as compared with a surface where a little amount of the metal element-containing particles are exposed, i.e. the laser drilling performance is made poor. In contrast, the amount of metal element-containing particles transferred on the surface of the bulk copper layer without carrier foil (F) of exceeding 100 mg/m$^2$ is not preferable since formation of copper oxide on the surface in the black-oxide treatment is made difficult and the decreased density of the treated black-oxide makes the laser drilling performance poor. More preferable disposition is to make amount of the metal element-containing particles transferred (F) 20 mg/m$^2$<F≤mg/m$^2$ from the viewpoint of black-oxide treated surface which achieves stable laser drilling performance.

A particle diameter of the metal element-containing particles is preferable to be 1 nano-meter to 250 nano-meters. The particle diameter is measured in the images of a field emission scanning electron microscopic view. Existence of the metal element-containing particles having a particle diameter exceeding 250 nano-meters is not preferable since the formation of copper oxide in the treated black-oxide at the sites is made difficult and the density of the treated black-oxide locally deviates and the deviation makes the laser drilling performance at the site poor. Note that although the lower limit value of the particle diameter is 1 nano-meter, less particle diameters may not cause any problem in laser drilling. However, in the direct measurement of a particle diameter by a field emission scanning electron microscope on the smaller particles, the accuracy of the particle diameters measured may be not sufficient. So, the lower limit is the value roughly estimated.

Further, the metal element-containing particles constituting the copper foil provided with a carrier foil according to the present invention are preferable to be disposed to make a coverage factor in a visual field of 5 μm×4 μm (A) [0% by area]<A≤[34% by area]. The coverage factor (A) of 0% by area is not preferable since the treated black-oxide formed on the surface of the bulk copper layer without carrier foil is not suitable for the laser drilling. In contrast, the coverage factor (A) of exceeding 34% by area is not preferable since the decreased density of the treated black-oxide formed on the surface of the bulk copper layer without carrier foil makes the laser drilling performance poor. More preferable coverage factor (A) is 13% by area to 32% by area since the treated black-oxide formed on the surface of the bulk copper layer without carrier foil tends to be suitable for the laser drilling.

Figure 2:
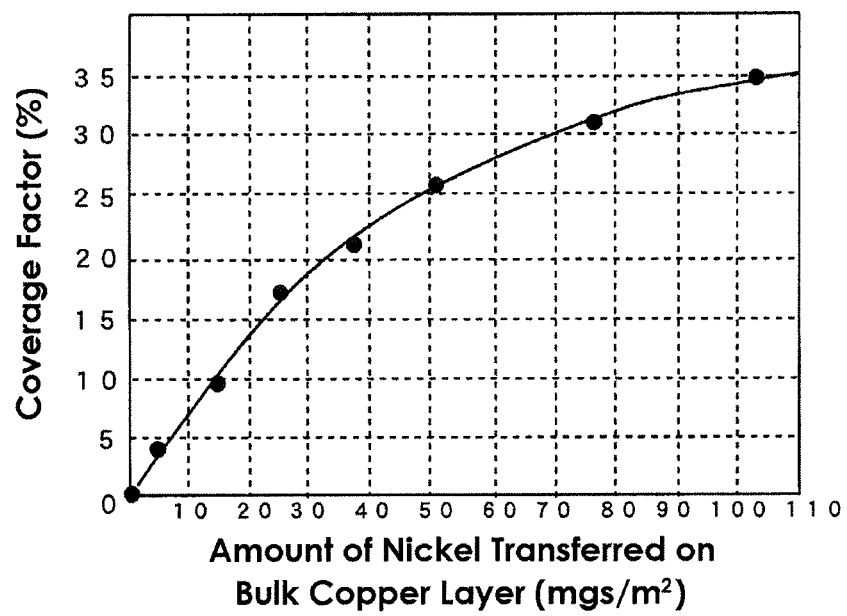
FIG. 2 is a graph showing a "relationship between the amount of nickel transferred and the coverage factor" if nickel particles as metal element-containing particles are transferred on the surface of a bulk copper layer.

FIG. 2 shows a "relationship between the amount of nickel transferred on the bulk copper layer and the coverage factor" when nickel particles as metal element-containing particles are exposed on the surface of a bulk copper layer. As is apparent in FIG. 2, the coverage factor tends to saturate as the amount of nickel transferred increases. The matter proves that the reasonable amounts of nickel transferred and the coverage factor described above corresponds.

The measuring method of the coverage factor will be described. The coverage factor is a numerical value determined by steps; observing of a surface of a releasing layer on which nickel particles as metal element-containing particles have been provided by a field emission scanning-electron microscope; image-processing of the field emission scanning electron microscope image to be a binarized image; and determination of the coverage percentage of the metal element-containing particles on the surface area of a releasing layer in the binarized image as a coverage factor (% by area).

Bulk copper layer: the bulk copper layer of the copper foil provided with a carrier foil according to the present invention is preferable to be an electro-deposited copper foil layer formed by an electro-deposition method. Although a so-called dry method including a vapor-deposition method and a chemical vapor reaction method may be employed in the formation of the bulk copper layer provided on the metal element-containing particles and the releasing layer, an electro-deposition method is preferable. The electro-deposition method is preferable because of inexpensive manufacturing costs as compared with a dry method and the suitable grain structure of formed copper for etching.

<Manufacturing Method of a Copper Foil Provided with a Carrier Foil>

The manufacturing method of a copper foil provided with a carrier foil according to the present invention is a manufacturing method of the copper foil provided with a carrier foil, and is characterized in comprising step 1 to step 3 described later. Hereinafter, each step will be described.

Figure 3:
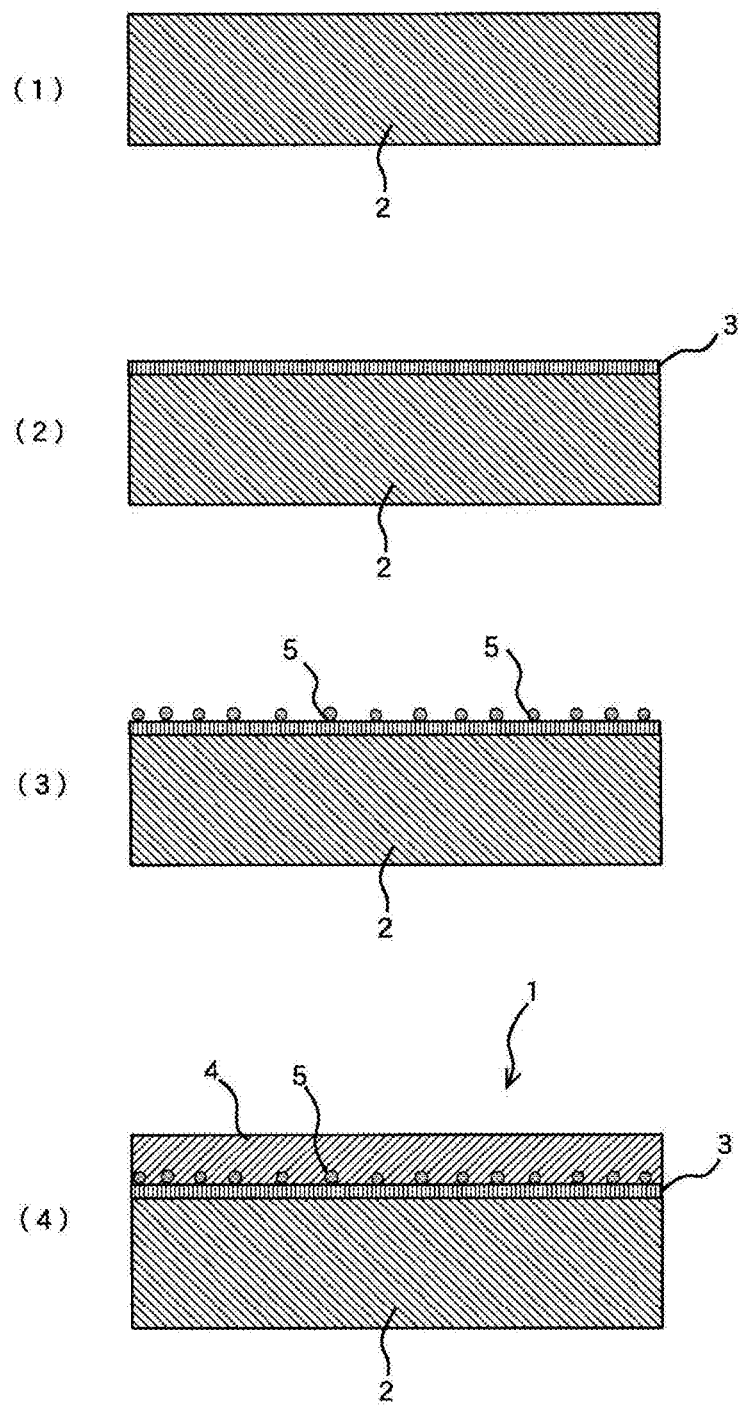
FIG. 3 is a schematic process flow demonstrating a manufacturing process of the copper foil provided with a carrier foil according to the present invention.

Step 1: step 1 prepare a "carrier foil 2 provided with the releasing layer 3" shown in FIG. 3(2) through formation of the releasing layer 3 on at least one surface of the carrier foil 2 shown in FIG. 3(1). As the formation method of the releasing layer 3, the following method can be employed.

To provide an organic releasing layer as the releasing layer 3, dissolving an organic compound in a solvent followed by immersing the carrier foil 2 in a solution, or carrying out methods including a showering, a spraying, a dropping and an electro-deposition on the surface of the carrier foil 2 on which the releasing layer 3 should be provided, i.e. the method is not especially limited.

Preferable concentration of an organic compound in the solution is 0.01 g/l to 10 g/l, and preferable solution temperature is 20 to 60° C. from the viewpoint of the practical operation employing organic compounds described above. The concentration of an organic compound is not especially limited, and higher and lower concentration may cause no problem since the concentration should be suitably adjusted according to the characteristics of the manufacturing apparatus.

On the other hand, if the releasing layer 3 is formed by using an inorganic releasing layer composed of chromium, nickel, molybdenum, tantalum, vanadium, tungsten, cobalt or an oxide of them, the formation method including an electro-deposition method and a physical vapor deposition method is carried out on the surface of the carrier foil 2 on which the releasing layer 3 should be formed. If the releasing layer 3 is an oxide, a metal layer may be first formed on the surface of the carrier foil 2 and then an anodic oxidation may convert the metal layer to an oxide layer.

Step 2: step 2 cathode polarize the carrier foil 2 provided with the releasing layer 3 in a metal compound-containing electrolytic solution to deposit metal element-containing particles 5 on the surface of the releasing layer 3 to prepare a carrier foil provided with the metal element-containing particles and the releasing layer. FIG. 3(3) shows the finished state schematically. To provide the metal element-containing particles 5 on the releasing layer 3, the metal element-containing particles 5 are deposited on the releasing layer 3 by a plating method using a solution containing metal elements for the metal element-containing particles 5. The plating condition is not especially limited as long as particles having diameter of 1 nano-meter to 250 nano-meters are deposited and a coverage factor (A) of [0% by area]<A≤ [34% by area] is achieved.

Step 3: step 3 cathode polarize the carrier foil 2 provided with the metal element-containing particles 5 and the releasing layer 3 in a copper electrolytic solution to provide the bulk copper layer 4 on the surface where the metal element-containing particles 5 and the releasing layer 3 are provided to finish a copper foil provided with a carrier foil 1. Applicable copper electrolytic solution includes a sulfuric acid base copper electrolytic solution and a pyrophosphoric acid base copper electrolytic solution and is not especially limited. Also the electrolytic condition is not especially limited as long as a level plating of copper is achieved.

Optional steps: after finishing the copper foil provided with a carrier foil as described above, various types of optional surface treatments may be further carried out on the surface of the bulk copper layer according to needs in usage of the copper foil provided with a carrier foil. For example, to improve the adhesion between the bulk copper layer and an insulating resin base material laminated, the surface of the bulk copper layer may be subjected to a roughening treatment to achieve the anchor effect.

Further, the long-term shelf-life, the prevention of oxidation due to loading heat in lamination and the like of the copper foil provided with a carrier foil 1 can be achieved by providing a rust-proofing treatment layer on the surface (including the roughening treated surface) of the bulk copper layer. As the rust-proofing treatment, "an organic rust-proofing compound including triazole or benzotriazole" and/or "an inorganic rust-proofing compound, a metal base rust-proofing compound including zinc, a zinc alloy, nickel, a nickel alloy, chromium and a chromium alloy, or an oxide base rust-proofing compound by a chromate treatment" are applicable.

Furthermore, adhesion between the bulk copper layer 4 and the insulating resin base material laminated may be further improved by a silane coupling agent treatment on the bulk copper layer. Applicable silane coupling agent is not especially limited. In consideration of an insulating layer-constituting material used and types of a plating solutions used in printed wiring boards manufacturing process, arbitrary selected silane coupling agents includes an epoxy base silane coupling agent, an amino base silane coupling agent, a mercapto base silane coupling agent. In a silane coupling agent treatment, a solution containing a silane coupling agent is used, and methods including dip coating, showering coating or electro-deposition may be employed.

<Copper Clad Laminate>

The copper clad laminate according to the present invention is a copper clad laminate for laser drilling manufactured by using the copper foil provided with a carrier foil. A copper clad laminate 10 shown in FIG. 4(2) is manufactured by laminating an insulating layer-constituting material 6 on the surface of the bulk copper layer 4 of the copper foil provided with a carrier foil 1 schematically shown in FIG. 4(1). Although the insulating layer-constituting material 6 should be an insulating resin substrate after finishing the lamination, common symbol 6 will be used in the drawing for convenience.

Figure 5:
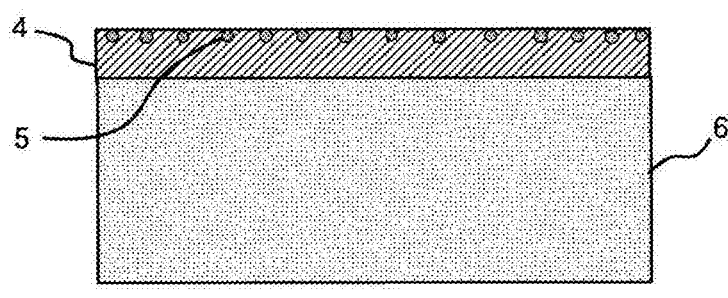
FIG. 5 is a schematic process flow demonstrating a manufacturing process of the copper clad laminate for laser drilling provided with a black-oxide treated surface according to the present invention.
Figure 5:
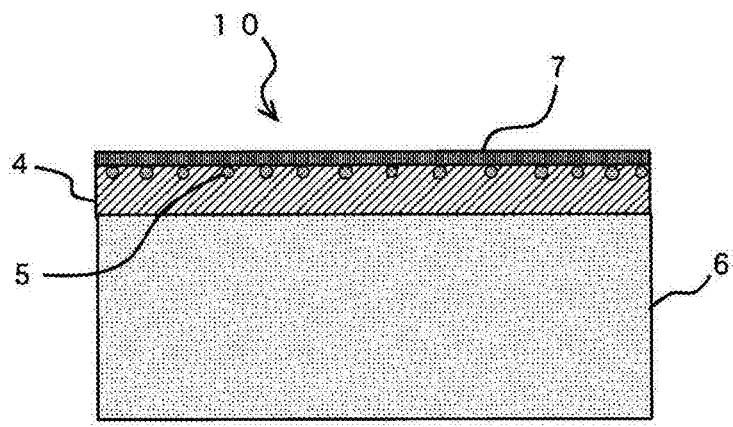

After the insulating layer-constituting material 6 is laminated on the surface of the bulk copper layer 4 of the copper foil provided with a carrier foil 1, the carrier foil 2 of the copper foil provided with a carrier foil 1 is removed as shown in FIG. 5(3). Releasing of the carrier foil 2 almost removes the releasing layer 3 together with the carrier foil 2.

Then, the bulk copper layer 4 exposing the metal element-containing particles 5 on the surface is subjected to a black-oxide treatment to form a black-oxide treated surface 7 and the copper clad laminate 10 is finished where the black-oxide treated surface is used as a laser drilled surface as shown in FIG. 5(4).

In a black-oxide treatment of the bulk copper layer 4 exposing the metal element-containing particles 5 on the surface, a local cell reaction may probably be caused between metal elements (for example, Ni) constituting metal element-containing particles and Cu in formation of a black-oxide treated surface 7. The metal elements constituting metal element-containing particles are stable in a black-oxide treatment solution to promote the oxidation of adjacent Cu in formation of the treated black-oxide and results a black-oxide treated surface 7 excellent in laser drilling performance.

The black-oxide treated surface 7 of the copper clad laminate 10 is featured by the L*a*b* color space as described later. By the way, the L*a*b* color space refers to a specification published by Commission Internationale de l'Eclairage (CIE) in 1976, and specified in Japan as JIS Z8729.

Figure 6:
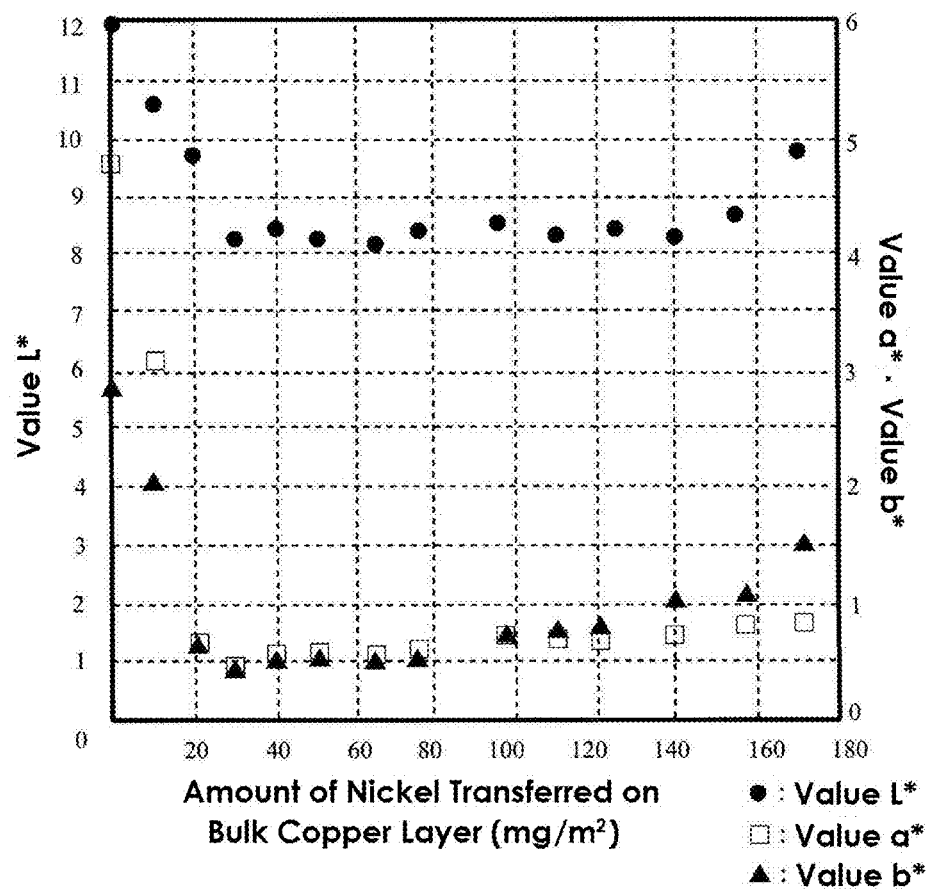
FIG. 6 is a graph showing relationships between the value L*, the value a*, and the value b* in the L*a*b* color space at a laser drilled surface (black-oxide treated surface) of a copper clad laminate and the amount of nickel transferred on the surface of a bulk copper layer.

The copper clad laminate according to the present invention is preferable to satisfy a relationship of [the value a*]≥[the value b*] between the value a* and the value b* in the L*a*b* color space at the laser drilled surface. As is apparent in FIG. 6, if the value b* exceed the value a* in the relationship between the value a* and the value b* is area where the amount of metal element-containing particles transferred on the bulk copper layer without carrier foil exceeds 100 mg/m$^2$, the black-oxide treated surface is not excellent in the laser drilling performance, i.e. the laser drilling performance tends to be poor.

Based on the relationship [the value a*]≥[the value b*], [the value a*]≤4.5 is preferable to be satisfied. If the value a* exceeds 4.5, as the surface of the bulk copper layer without carrier foil may include the state where amount of metal element-containing particles transferred (F) is 0 mg/m$^2$, it is apparent that a treated black-oxide formed on the surface of the bulk copper layer may be not suitable for the laser drilling. Further, [the value a*]≤1.0 is more preferable since it makes the transferred amount (F) 20 mg/m$^2$≤F≤80 mg/m$^2$ and further stabilizes the laser drilling performance.

Note that, the value a* is an index indicating a color tone and a chroma; a positive value of a* indicates the red direction, and a negative value of a* indicates the green direction; and the numerical value more apart from the center (a*=0) indicates that the color tends to be sharp, and the numerical value nearer the center indicates that the color tends to be dull. Next, the value b* is an index indicating a color tone and a chroma; a positive value of b* indicates the yellow direction, and a negative value of b* indicates the blue direction; and the numerical value apart from the center (b*=0) indicates that the color tends to be sharp, and the numerical value nearer the center indicates that the color tends to be dull.

The value L* in the L*a*b* color space at the laser drilled surface will be described. As is apparent in FIG. 6, preferable value L* at the black-oxide treated surface for the laser drilling is lower than 12 in consideration that the amount of metal element-containing particles transferred on the surface of the bulk copper layer without carrier foil (F) is 0 mg/m$^2$<F≤100 mg/m$^2$. If the value L* is 12 or higher, the laser drilling performance tends to deviates and the shape of via-holes formed by laser drilling may be out of the target, i.e. laser drilling performance tends to be poor. Then, more preferable value L* at the black-oxide treated surface for laser drilling is lower than 10 in consideration that the amount of metal element-containing particles transferred on the surface of the bulk copper layer without carrier foil (F) of the best range is 20 mg/m$^2$≤F≤80 mg/m$^2$.

<Example>

In Example, a copper foil provided with a carrier foil was manufactured by a method described later; and then a copper clad laminate was manufactured followed by investigation of the laser drilling performance. Hereinafter, these matters will be described in this order.

<Manufacturing of a Copper Foil Provided with a Carrier Foil>

The copper foil provided with a carrier foil in Example was manufactured through the following step 1 to step 4.

Hereinafter, each step will be described.

Step 1: in step 1, an electro-deposited copper foil of 18 µm thick was used as the carrier foil 2, and the releasing layer 3 was provided on one surface having surface roughness (Rzjis) of 0.6 µm as shown in FIG. 3(1). The surface roughness was measured according to JIS B 0601 using a stylus type surface roughness meter equipped a diamond stylus whose tip curvature radius is 2 µm.

In formation of the releasing layer 3, the carrier foil 2 was immersed in an organic compound-containing dilute sulfuric acid aqueous solution composed of sulfuric acid concentration of 150 g/l, a copper concentration of 10 g/l and CBTA concentration of 800 ppm at a solution temperature of 30° C. for 30 sec to remove contaminations sticking to the electro-deposited copper foil by acid pickling and to simultaneously adsorb CBTA on the surface to provide a releasing layer on the surface of the carrier foil 2 to prepare a "carrier foil 2 provided with the releasing layer 3" shown in FIG. 3(2).

Step 2: in step 2, the carrier foil 2 provided with the releasing layer 3 was cathode polarized in a metal element-containing electrolytic solution to deposit metal element-containing particles 5 on the releasing layer 3 to prepare "carrier foil 2 provided with the metal element-containing particles 5 and the releasing layer 3" shown in FIG. 3(3). 8 kinds of samples provided with different amounts of nickel were prepared by changing the electrolysis time using a Watts bath of pH 3 as a nickel electrolytic solution composed of nickel sulfate (NiSO$_4$.6H$_2$O) concentration of 250 g/l, nickel chloride (NiCl$_2$.6H$_2$O) concentration of 45 g/l, and boric acid concentration of 30 g/l; and the electrolysis was carried out at a solution temperature of 45° C. and current density of 0.4 A/dm$^2$.

Step 3: in step 3, the "carrier foil 2 provided with the metal element-containing particles 5 and the releasing layer 3" was cathode polarized to provide the bulk copper layer 4 on the surface where the metal element-containing particles 5 is provided on the releasing layer 3 to prepare a copper foil provided with a carrier foil 1. In the formation of the bulk copper layer, a copper sulfate solution composed of a copper (as CuSO$_4$.5H$_2$O) concentration of 255 g/l and a sulfuric acid concentration of 70 g/l at 45° C. was electrolyzed with a current density of 30 A/dm$^2$ to provide the bulk copper layer of 3 µm thick to prepare 8 kinds of peelable-type copper foils provided with a carrier foil 1.

Step 4: in step 4, the surface of the bulk copper layer of the copper foil provided with a carrier foil obtained in step 3 was subjected to a surface treatment. In the surface treatment without roughening treatment, a zinc-nickel alloy rust-proofing layer was provided followed by subjecting an electrolytic chromate treatment and an amino base silane coupling agent treatment to prepare 8 kinds of copper foils provided with a carrier foil P1 to P8. Specific features of these samples are shown in Table 1 with Comparative Example Samples for easy comparison.

<Manufacturing of a Copper Clad Laminate>

Figure 4:
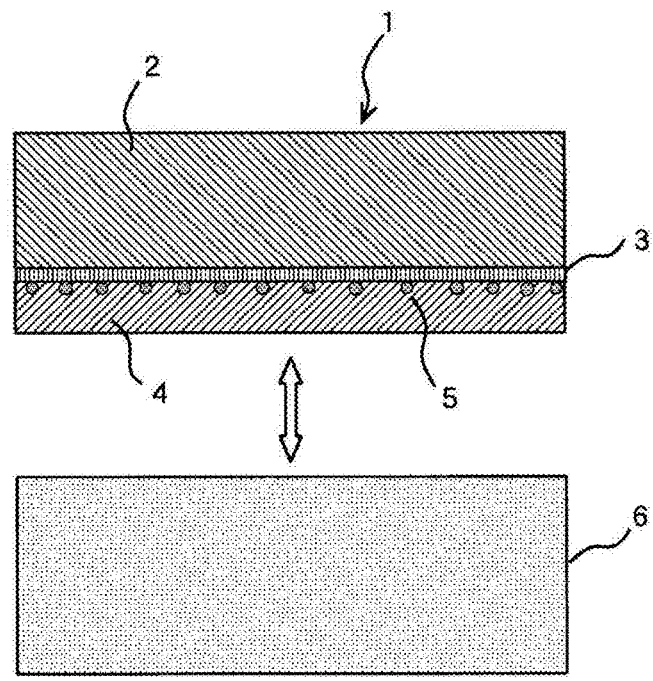
FIG. 4 is a schematic process flow demonstrating a manufacturing process of the copper foil provided with a carrier foil according to the present invention.
Figure 4:
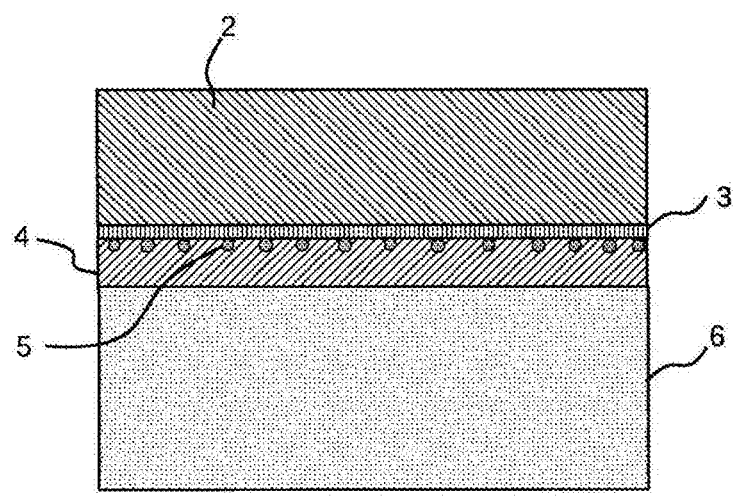

In Example, using the 8 kinds of copper foils provided with a carrier foil, a pre-preg of 100 µm thick as an insulating layer-constituting material 6 was laminated on the surface treated layer of the bulk copper layer 4 of the copper foil provided with a carrier foil 1 as schematically shown in FIG. 4(1) and hot pressed to finish the state shown in FIG. 4(2).

Then, the carrier foil 2 and the releasing layer 3 of the copper foil provided with a carrier foil 1 were simultaneously released to finish the state shown in FIG. 5(3).

Then, Example Samples 1 to 8 as a copper clad laminate 10 for a laser drilling shown in FIG. 5(4) were finished by subjecting a black-oxide treatment using PROBOND80 of Rohm and Haas Electronic Materials K.K. on the bulk copper layer 4 exposing metal element-containing particles 5 on the surface to form a black-oxide treated surface 7 on the surface of the bulk copper layer 4.

<Evaluation Methods>

Measurement method of the value L*, the value a* and the value b* at a black-oxide treated surface: these values were measured according to JIS 28729 using a model SE2000 manufactured by Nippon Denshoku Industries Co., Ltd.

Evaluation of the laser drilling performance: in the evaluation of the laser drilling performance, a carbon dioxide gas laser was used. The irradiation condition of the carbon dioxide gas laser for formation of hole-diameter 60 µm in copper clad laminates provided with copper foils after finishing black-oxide treatment was a pulse width of 6 micro-seconds, a pulse energy of 2.5 milli-joule and a laser beam diameter of 85 µm. The judgment of the present inventors for the excellent laser drilling performance is hole-diameter of 55 µm to 65 µm. The evaluation results are shown in Table 2 together with the evaluation results of Comparative Examples.

COMPARATIVE EXAMPLES

Comparative Example 1

Comparative Example 1 omitted step 2 in Example, i.e. no metal element-containing particles 5 is deposited on the surface of the releasing layer 3. With the other conditions same as in Example, a peelable-type copper foil provided with a carrier foil C1 and a Comparative Example Sample 1 was finished by using the copper foil provided with a carrier foil C1.

Comparative Example 2

Comparative Example 2 carried out long electrolysis time in step 2 than Example to excessively deposit metal element-containing particles 5 on the surface of the releasing layer 3 and achieve "the amount of metal element-containing particles transferred on the surface of the bulk copper layer without carrier foil exceed 100 mg/m$^2$". With the other conditions same as in Example, a peelable-type copper foil provided with a carrier foil C2 and a Comparative Example Sample 2 was finished by using the copper foil provided with a carrier foil C2.

Comparison Among Examples and Comparative Examples

In comparison among Examples and Comparative Examples, differences among Example Samples and Comparative Example Samples in features and the evaluation results are shown in Table 1 and Table 2 shown below to make understanding easy.

TABLE 1

| | | Copper foil provided with a carrier foil | | |
|---|---|---|---|---|
| | Sample | Presence/Absence of Metal Element-Containing Particles | Amount of Nickel transferred* mgs/m$^2$ | Coverage Factor % by area |
| Example | Copper foil provided with a carrier foil P1 | present | 10 | 7.4 |
| | Copper foil provided with a carrier foil P2 | | 20 | 13.3 |
| | Copper foil provided with a carrier foil P3 | | 30 | 18.9 |
| | Copper foil provided with a carrier foil P4 | | 40 | 22.7 |
| | Copper foil provided with a carrier foil P5 | | 50 | 25.2 |
| | Copper foil provided with a carrier foil P6 | | 65 | 28.3 |
| | Copper foil provided with a carrier foil P7 | | 75 | 31.1 |
| | Copper foil provided with a carrier foil P8 | | 95 | 33.7 |
| Comparative Example | Copper foil provided with a carrier foil C1 | absent | 0 | 0.0 |
| | Copper foil provided with a carrier foil C2 | present | 110 | 35.3 |

*amount of nickel transferred: an amount of nickel transferred on the bulk copper layer surface after releasing the carrier foil As is apparent in Table 1, the amount of nickel transferred on the surface of the bulk copper layer without carrier foil (F) of the copper foils provided with a carrier foil P1 to P8 in Example are 0 mg/m$^2$<F 100 mg/m$^2$. In contrast, in the copper foils provided with a carrier foil C1 and C2 in Comparative Examples, the amount of nickel transferred are out of the preferable range.

TABLE 2

| | | | Evaluation of Black-oxide treated Surface | | | Evaluation of Laser Drilling Performance | |
|---|---|---|---|---|---|---|---|
| | Sample | Copper Foil Used | Value L* | Value a* | Value b* | Hole Diameter/ micrometers | Judgment |
| Example | Example Sample 1 | P1 | 10.9 | 3.1 | 2.2 | 61 | Good |
| | Example Sample 2 | P2 | 9.7 | 0.7 | 0.7 | 62 | |
| | Example Sample 3 | P3 | 8.3 | 0.5 | 0.4 | 63 | |
| | Example Sample 4 | P4 | 8.5 | 0.6 | 0.6 | 63 | |
| | Example Sample 5 | P5 | 8.3 | 0.6 | 0.5 | 62 | |
| | Example Sample 6 | P6 | 8.2 | 0.5 | 0.5 | 62 | |
| | Example Sample 7 | P7 | 8.4 | 0.6 | 0.5 | 62 | |
| | Example Sample 8 | P8 | 8.6 | 0.7 | 0.7 | 55 | |

TABLE 2-continued

| Sample | | Copper Foil Used | Evaluation of Black-oxide treated Surface | | | Evaluation of Laser Drilling Performance | |
|---|---|---|---|---|---|---|---|
| | | | Value L* | Value a* | Value b* | Hole Diameter/ micron-meters | Judgment |
| Comparative Example | Comparative Example Sample 1 | C1 | 12.0 | 4.8 | 2.9 | 45 | Not Good |
| | Comparative Example Sample 2 | C2 | 8.3 | 0.7 | 0.9 | 53 | |

As is apparent in Table 2, the parameters at the black-oxide treated surface of the Example Sample 1 to Example Sample 8 finished by using the copper foils provided with a carrier foil P1 to P8 in Example are in the preferable range. In contrast, in Comparative Example Sample 1 using the copper foil provided with a carrier foil C1 in Comparative Examples, the value L*, the value a* and the value b* are out of the preferable range. In Comparative Example Sample 2 finished by using the copper foil provided with a carrier foil C2 in Comparative Example, it is apparent that although the Value L*, the value a* and the value b* are in the preferable ranges, the "relationship [the value a*] [the value b*]" is not satisfied, i.e. Comparative Example Sample 2 is apparently out of the preferable range.

Figure 7:
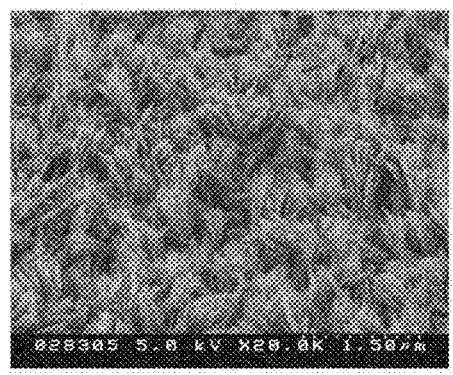
FIG. 7 is scanning electron microscopic images to compare shapes of black-oxide treated surfaces in Example Samples and Comparative Example Samples.
Figure 7:
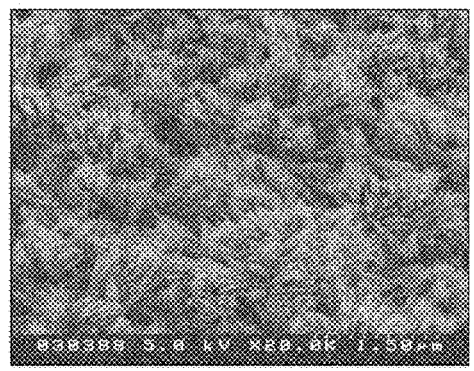
Figure 7:
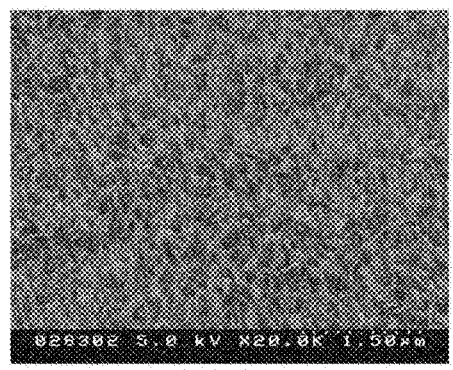
Figure 7:

Next, FIG. 7 will be referred to. FIG. 7 shows shapes of the treated black-oxide finished in Example (Example Sample 1 and Example Sample 7) and Comparative Examples (Comparative Example Sample 1 and Comparative Example Sample 2). The shape of the treated black-oxide finished of Comparative Example Sample 1 in which nickel particles are not provided is the popular treated black-oxide conventionally carried out. It is apparent that very dense copper oxide having uniform shapes are formed on the surface of the bulk copper layer. In Comparative Example Sample 2 exposing excessive amount of nickel transferred, copper oxide is not uniformly grown in the black-oxide treated surface and sites where nickel particles are exposed and not covered with copper oxide exist. In contrast, the shape of the copper oxide covering the black-oxide treated surfaces in Example Sample 1 and Example Sample 7 grow to be coarser than the copper oxide in Comparative Example Sample 1. In comparison of the shapes of copper oxide at the black-oxide treated surfaces of Example Sample 1 and Example Sample 7 with the shape of the copper oxide at the black-oxide treated surface of Comparative Example Sample 2, it is apparent that the treated black-oxide covers more uniformly in the Example Samples. That is, it is apparent that the shapes of copper oxide on the black-oxide treated surfaces of Example Sample 1 and Example Sample 7 could be distinguished and recognized as a shape suitable for laser drilling.

As is apparent in Table 2, if the laser drilling is carried out on the black-oxide treated surfaces of Example Sample 1 to Example Sample 8, all of hole diameters finished are 55 μm to 63 μm, i.e. laser drilling performance is excellent. In contrast in Comparative Example Samples 1 and 2, hole diameters finished by the laser drilling are smaller than 55 μm, i.e. laser drilling performance is poor.

Figure 8:
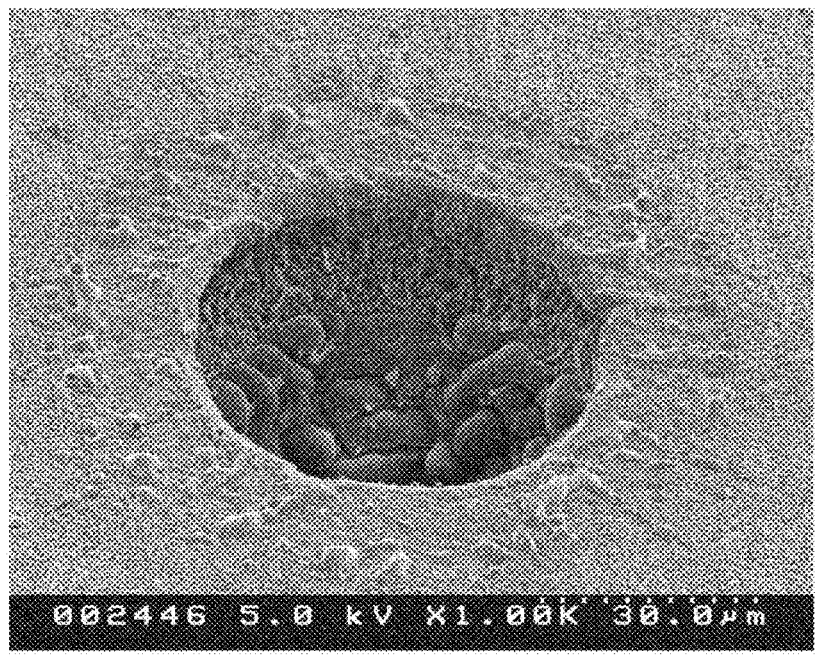
FIG. 8 is scanning electron microscopic images of holes after laser drilling to compare shapes of hole in Example Samples and Comparative Example Samples.
Figure 8:
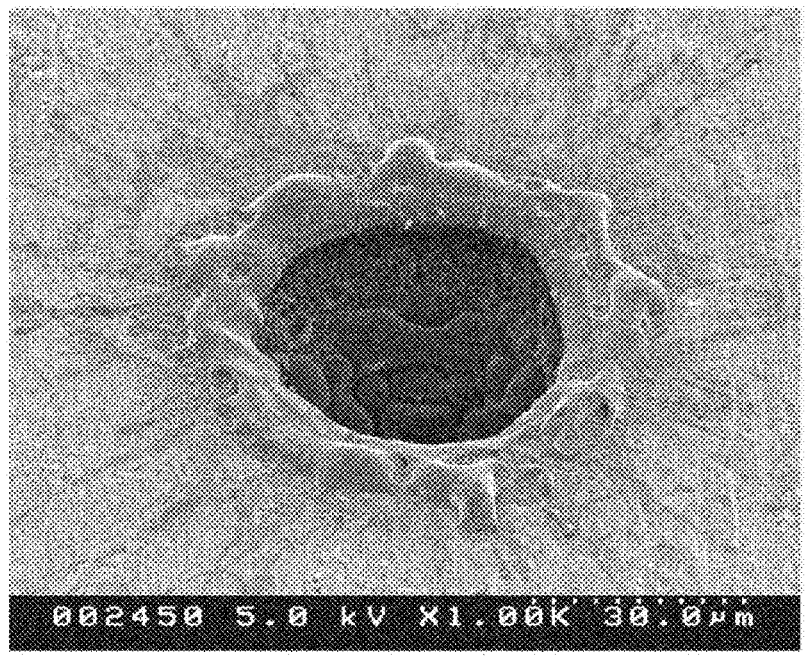

FIG. 8 shows finished shapes of holes after the laser drilling using Example Sample 1 to Example Sample 8 and using Comparative Example Sample 1 and Comparative Example Sample 2. As is apparent in FIG. 8, it is apparent that the shape of hole using the Example Samples have beautiful hole circumference and hole diameters are large as compared with the holes using the Comparative Example Samples.

As described above, it is proved that employment of a copper foil provided with a carrier foil in which "the amount of metal element-containing particles transferred on the surface of a bulk copper layer without carrier foil (F) of 0 mg/m$^2$<F≤100 mg/m$^2$" is preferable to achieve an excellent laser drilling performance in a black-oxide treated surface of a copper clad laminate.

INDUSTRIAL APPLICABILITY

The copper foil provided with a carrier foil according to the present invention has a layer structure of a carrier foil/a releasing layer/a bulk copper layer, wherein metal element-containing particles are disposed between the releasing layer and the bulk copper layer. If a copper clad laminate using the copper foil provided with a carrier foil is manufactured and the surface of the bulk copper layer after releasing the carrier foil is subjected to a black-oxide treatment, as the shape of copper oxide after finishing the black-oxide treatment is made suitable for laser drilling, excellent laser drilling performance is achieved. That is, printed wiring boards having an excellent quality can be provided by using popular technologies and conventional equipment.

SYMBOL LIST

1 COPPER FOIL PROVIDED WITH A CARRIER FOIL
2 CARRIER FOIL
3 RELEASING LAYER
4 BULK COPPER LAYER
5 METAL ELEMENT-CONTAINING PARTICLE
6 INSULATING LAYER-CONSTITUTING MATERIAL (INSULATING LAYER)
7 BLACK-OXIDE TREATED LAYER

The invention claimed is:
1. A copper foil laminate comprising a layer structure of a carrier foil/
a releasing layer/
a bulk copper layer, wherein metal element-containing particles are dispersively disposed between the releasing layer and the bulk copper layer;

wherein when the carrier foil is released from the surface of the copper foil laminate, the releasing layer is removed, and metal element-containing particles are exposed on the surface of the bulk copper layer; and wherein the metal element-containing particles are disposed to make a coverage factor (A) in a visual field of 5 μm×4 μm that meets the relationship

[0% by area]$<A\leq$[34% by area].

2. The copper foil laminate according to claim 1, wherein the metal element-containing particles contain one or more of elements selected from nickel, cobalt, molybdenum, tin and chromium.

3. The copper foil laminate according to claim 1, wherein the metal element-containing particles are disposed to make an amount transferred on a surface of the bulk copper layer after releasing carrier foil (F) 0 mg/m$^2$<F$\leq$100 mg/m$^2$.

4. The copper foil laminate according to claim 1, wherein a particle diameter of the metal element-containing particles is 1 nano-meter to 250 nano-meters.

5. The copper foil laminate according to claim 1, wherein the bulk copper layer is an electro-deposited copper foil layer formed by an electro-deposition method.

6. A manufacturing method of the copper foil laminate according to claim 1 comprising:
1: formation of a releasing layer on at least one surface of the carrier foil to prepare a carrier foil provided with the releasing layer;
2: cathode polarizing of the carrier foil provided with the releasing layer in a metal element-containing electrolytic solution to dispersively deposit metal element-containing particles on a surface of the releasing layer to prepare a carrier foil provided with the dispersed metal element-containing particles and the releasing layer; and
3: cathode polarizing of the carrier foil provided with the dispersed metal element-containing particles and the releasing layer in a copper electrolytic solution to form a bulk copper layer on the surfaces of the dispersed metal element-containing particles and the releasing layer to finish the copper foil provided with a carrier foil.

7. A copper clad laminate for laser drilling manufactured by using the copper foil laminate according to claim 1, wherein
the carrier foil is released from the surface of the copper clad laminate provided with the copper foil provided with a carrier foil at an outer layer,
a black-oxide treatment is subjected on the bulk copper layer exposing the metal element-containing particles on the surface, and
the black-oxide treated surface is used as a laser drilled surface.

8. The copper clad laminate for laser drilling according to claim 7, wherein a value a* and a value b* in an L*a*b* color space at the laser drilled surface satisfy the relationship: [the value a*]$\geq$[the value b*].

9. The copper clad laminate for laser drilling according to claim 7, wherein a value a* in an L*a*b* color space at the laser drilled surface is 4.5 or less.

* * * * *